United States Patent
Lin

(10) Patent No.: US 9,152,237 B1
(45) Date of Patent: Oct. 6, 2015

(54) POWER BOUNCING REDUCTION CIRCUIT AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 14/306,260

(22) Filed: Jun. 17, 2014

(51) Int. Cl.
*G05F 1/10* (2006.01)
*G06F 3/02* (2006.01)

(52) U.S. Cl.
CPC ........................................ *G06F 3/02* (2013.01)

(58) Field of Classification Search
CPC ............ G05F 1/467; G05F 3/24; G05F 3/247
See application file for complete search history.

(56) References Cited

U.S. PATENT DOCUMENTS

| | | | | |
|---|---|---|---|---|
| 5,204,554 A | * | 4/1993 | Ohannes et al. | 326/33 |
| 5,394,028 A | * | 2/1995 | Feddeler et al. | 327/544 |
| 5,438,277 A | * | 8/1995 | Sharpe-Geisler | 326/27 |
| 6,489,834 B2 | * | 12/2002 | Naffziger et al. | 327/534 |

* cited by examiner

*Primary Examiner* — Jeffrey Zweizig
(74) *Attorney, Agent, or Firm* — McClure, Qualey & Rodack, LLP

(57) ABSTRACT

A circuit having a core circuit for sinking a first current from a first internal power supply node; a power bouncing reduction circuit for receiving power from a second internal power supply node and sourcing a second current to the first internal power supply node in accordance with a comparison between a voltage at the first internal power supply node and a low-pass filtered voltage of the first internal power supply node; and a package for coupling the first internal power supply node and the second internal power supply node to a first external power supply node and a second external power supply node, respectively.

7 Claims, 7 Drawing Sheets

US 9,152,237 B1

POWER BOUNCING REDUCTION CIRCUIT AND METHOD THEREOF

BACKGROUND OF THE INVENTION

1. Field of the Invention

The present invention relates to integrated circuits.

2. Description of Related Art

Persons of ordinary skill in the art understand terms and basic concepts related to microelectronics that are used in this disclosure, such as PMOS (p-channel metal-oxide semiconductor) transistor, NMOS (p-channel metal-oxide semiconductor) transistor, "inductor," "capacitor," "resistor," "voltage," "current," "current-source," "circuit node," "low-pass filter," "pre-amplifier," "comparator," "clock," and "latch." Terms and basic concepts like these are apparent from prior art documents, e.g. text books such as "Design of Analog CMOS Integrated Circuits" by Behzad Razavi, McGraw-Hill (ISBN 0-07-118839-8), and thus will not be explained in detail here.

An integrated circuit (IC) comprises a large number transistors fabricated on a silicon. The integrated circuit is packaged in a package so that it can be placed as an IC component on a printed circuit board. The integrated circuit receives power from a power supply circuit on the printed circuit board.

As depicted in FIG. 1A, an application 100 comprises: a power supply circuit 130 and an IC component 140. The power supply circuit 130 provides a power supply voltage Vps for IC component 140. The IC component 140 comprises an integrated circuit 110 and a package 120, which can be behaviorally modeled as a circuit comprising a combination of a shunt capacitor 122 and a serial inductor 123. The voltage that the integrated circuit 110 actually receives is an internal power supply voltage Vdd, which is different from Vps that the power supply circuit 130 provides. The integrated circuit 110 comprises a large number of transistors working on a variety of tasks that vary from time to time, and the current I that the integrated circuit 110 is sinking also varies from time to time, due to a dynamic nature of the activities of the integrated circuit 110. As a result, the received voltage Vdd is also dynamically changing in accordance with the activities of the integrated circuit 110.

An exemplary waveform is shown in FIG. 1B. Trace 180 denotes the current I that the integrated circuit 110 is sinking; trace 190 denotes the internal power supply voltage Vdd. As shown in FIG. 1B, a sudden surge of the current (due to a sudden increase in circuit activities) induces a bouncing of the voltage due to an interplay between the inductor 123, the capacitor 122, and the integrated circuit 110. The phenomenon that the internal power supply voltage Vdd starts ringing upon a sudden surge of current of the integrated circuit 110 is known as "power bouncing." Power bouncing is highly undesirable, as it makes the integrated circuit 110 less reliable. A package with smaller inductance can be used to alleviate the power bouncing problem; however, a lower inductance package is usually more expensive.

What is desired is a method and apparatus for reducing power bouncing without using low inductance package.

BRIEF SUMMARY OF THIS INVENTION

An objective of this present invention is to reduce a bouncing of an internal power supply voltage within an integrated circuit.

An objective of this present invention is to rapidly source a current to a power supply node when a voltage at the power supply node is rapidly drooping due to a sudden surge in activities of circuits that receive power from the internal power supply node.

In an embodiment, an integrated circuit component comprises: a core circuit for sinking a first current from a first internal power supply node; a power bouncing reduction circuit for receiving power from a second internal power supply node and sourcing a second current to the first internal power supply node in accordance with a change of voltage at the first internal power supply node; and a package for coupling the first internal power supply node and the second internal power supply node to a first external power supply node and a second external power supply node, respectively. In an embodiment, the change of voltage at the first internal power supply node is detected by comparing a difference between the voltage at the first internal power supply node and a low-pass filtered voltage obtained by low-pass filtering the first internal power supply node. In an embodiment, the second current is turned on when it is detected by a comparison that the voltage at the first internal power supply node is lower than a low-pass filtered voltage. In an embodiment, the power bouncing reduction circuit comprises: a low-pass filter for receiving the voltage at the first power supply node and outputting a low-pass filtered voltage; a comparator for outputting a logical signal in accordance with a comparison between the voltage at the first internal power supply node and the low-pass filtered voltage; and an output device controlled by the logical signal for outputting the second current. In an embodiment, the comparator comprises a pre-amplifier and a latch.

In an embodiment, a method comprises: receiving a first supply voltage at a first circuit node; receiving a second supply voltage from a second circuit node; low-pass filtering the first supply voltage to obtain a low-pass filtered voltage; generating a logical signal by comparing the first supply voltage with the low-pass filtered voltage; and sourcing a current from the second circuit node to the first circuit node via a device controlled by the logical signal.

DETAILED DESCRIPTION OF THE DRAWINGS

DETAILED DESCRIPTION OF THIS INVENTION

The present invention relates to integrated circuits. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Figure 1A:
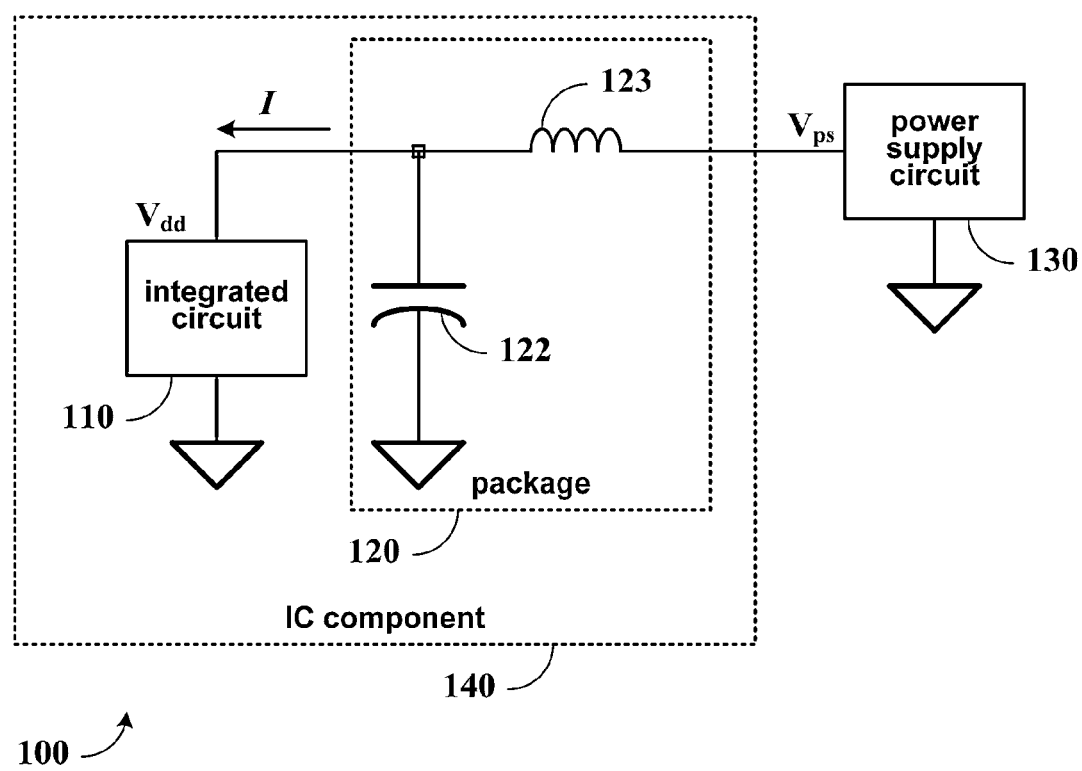
FIG. 1A shows a functional block diagram of an application circuit.
Figure 1B:
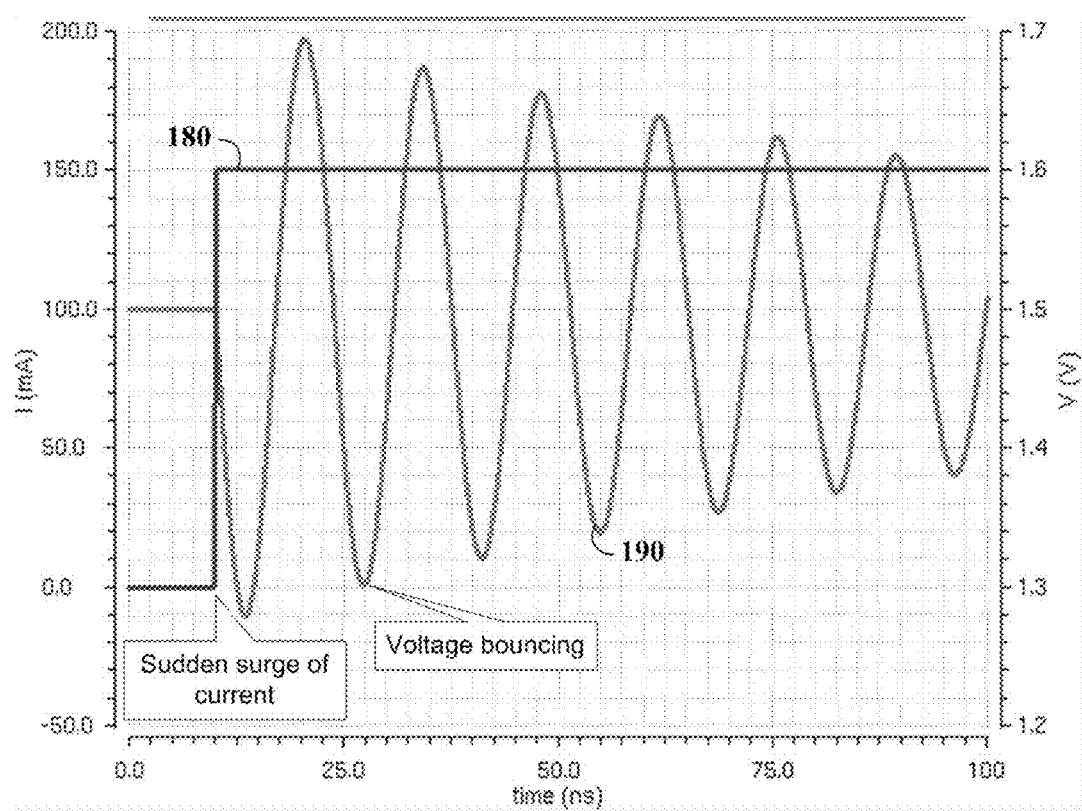
FIG. 1B shows an exemplary waveform of a power bouncing.
Figure 2:
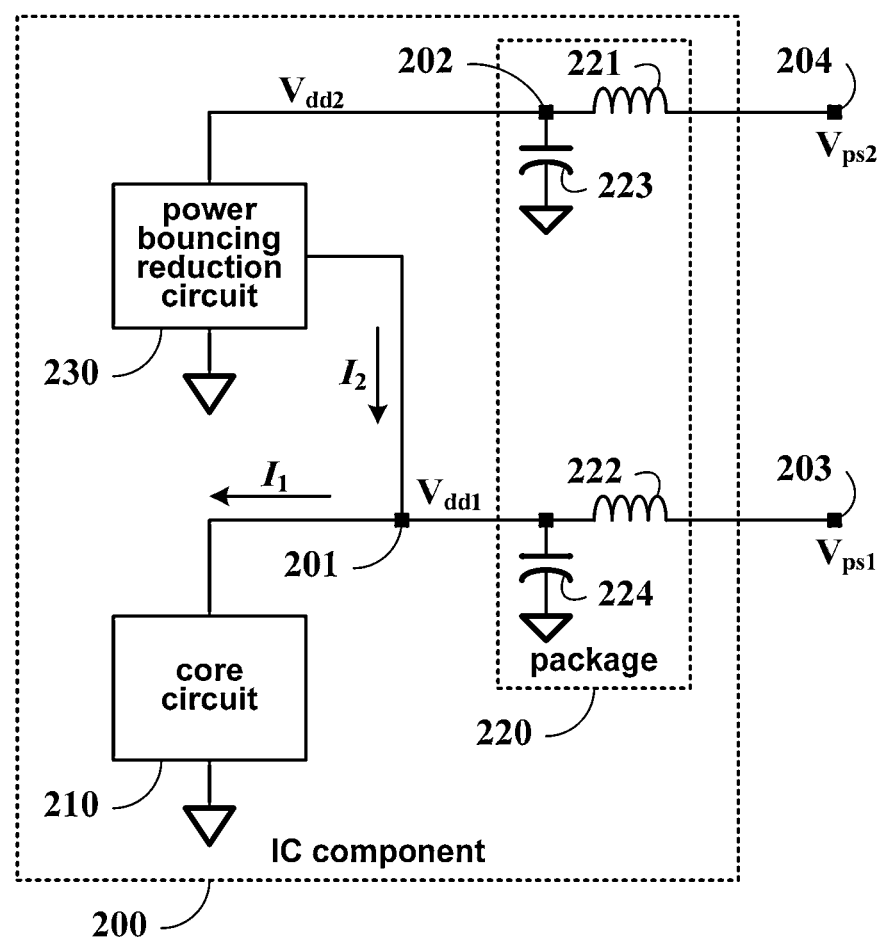
FIG. 2 shows a functional block diagram of an IC component in accordance with an embodiment of the present invention.

As shown in FIG. 2, a packaged IC component 200 in accordance with an embodiment of the present invention comprises: a core circuit 210, a package 220, and a power bouncing reduction circuit 230. The core circuit 210 receives power from a first external power supply voltage Vps1 at a first external power supply node 203 via the package 220; while the power bouncing reduction circuit 230 receives power from a second external power supply voltage Vps2 at a second external power supply node 204, also via the package 220. Note that serial inductors 221 and 222, and shunt capacitors 223 and 224 are part of a behavioral model of the package 220. Due to coupling through the package 220, the voltage that the core circuit 210 actually receives is a first internal power supply voltage Vdd1 (at circuit node 201), while the voltage that the power bouncing reduction circuit 230 actually receive is a second internal power supply voltage Vdd2 (at circuit node 202). The core circuit 210 sinks a first current I1 from the circuit node 201. The power bouncing reduction circuit 230 sources a second current I2 into the circuit node 201 in response to a drooping of the first internal power supply voltage Vdd1. Under a fast transition condition where the first current I1 is rapidly surging, the first internal power supply voltage Vdd1 will be rapidly drooping; in this case, the power bouncing reduction circuit 230 senses the rapid drooping of the first internal power supply voltage Vdd1 and in response rapidly injects the second current I2 to counteract the rapid drooping of the first internal power supply voltage Vdd1. By way of example but not limitation, in one embodiment, the first external power supply voltage Vps1 is 1.5V and the second external power supply voltage Vps2 is 3.3V. In any case, the second external power supply voltage Vps2 must be sufficiently higher than the first external power supply voltage Vps1 to enable the power bouncing reduction circuit 230 to effectively source the second current I2 into the circuit node 201.

Figure 3:
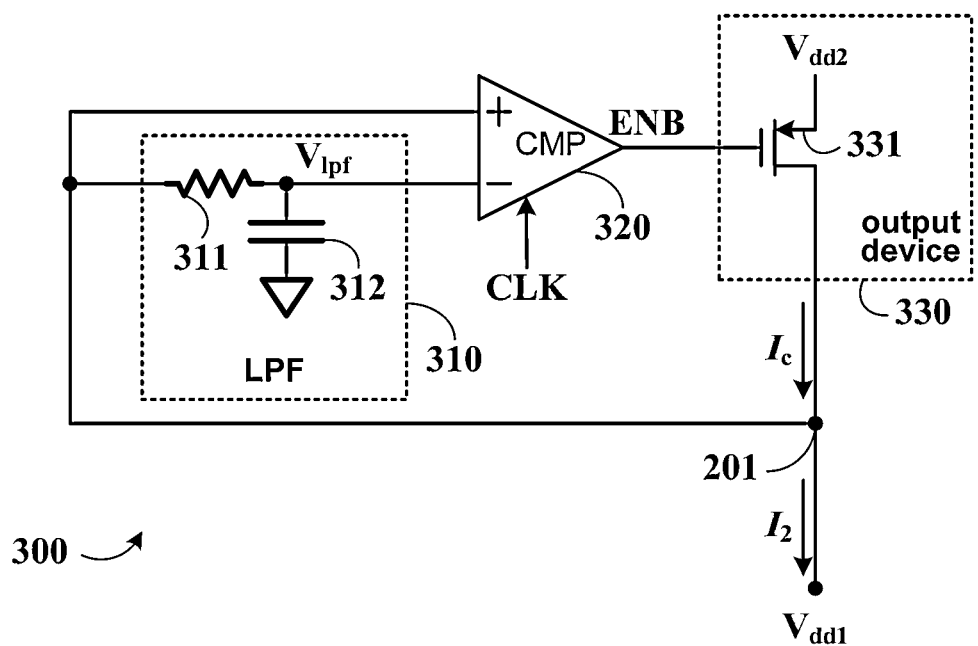
FIG. 3 shows a schematic diagram of a power bouncing reduction circuit in accordance with an embodiment of the present invention.

A schematic diagram of a power bouncing reduction circuit 300 suitable for embodying the power bouncing reduction circuit 230 of FIG. 2 is depicted in FIG. 3. Power bouncing reduction circuit 300 comprises: a low-pass filter (LPF) 310 for receiving the first internal power supply voltage Vdd1 and outputting a low-pass filtered voltage Vlpf; a comparator (CMP) 320 for outputting a logical, enabling signal ENB in accordance with a difference between the first internal power supply voltage Vdd1 and the low-pass filtered voltage Vlpf upon an edge of a clock signal CLK; and an output device 330 for receiving the enabling signal ENB and outputting a compensation current Ic, which is approximately equal to the second current I2 that is sourced to the circuit node 201 of the first internal power supply voltage Vdd1. LPF 310 comprises a serial resistor 311 and a shunt capacitor 312. Output device 330 comprises a PMOS transistor 331. LPF 310, comparator 320, and output device 330 forms a negative-feedback loop to regulate the first internal power supply voltage Vdd1 in the event of a power drooping. A rapid falling Vdd1 will be lower than the low-pass filtered voltage Vhpf, resulting in a logical "0" value of the enabling signal ENB that enables the output device 330 to activate the compensation current Ic to counteract the rapid falling of Vdd1. When the first internal power supply voltage Vdd1 is higher than the low-pass filtered voltage Vlpf, the enabling signal ENB will stays high, the output device 330 won't be enabled and the compensation current Ic is shut off.

Figure 4:
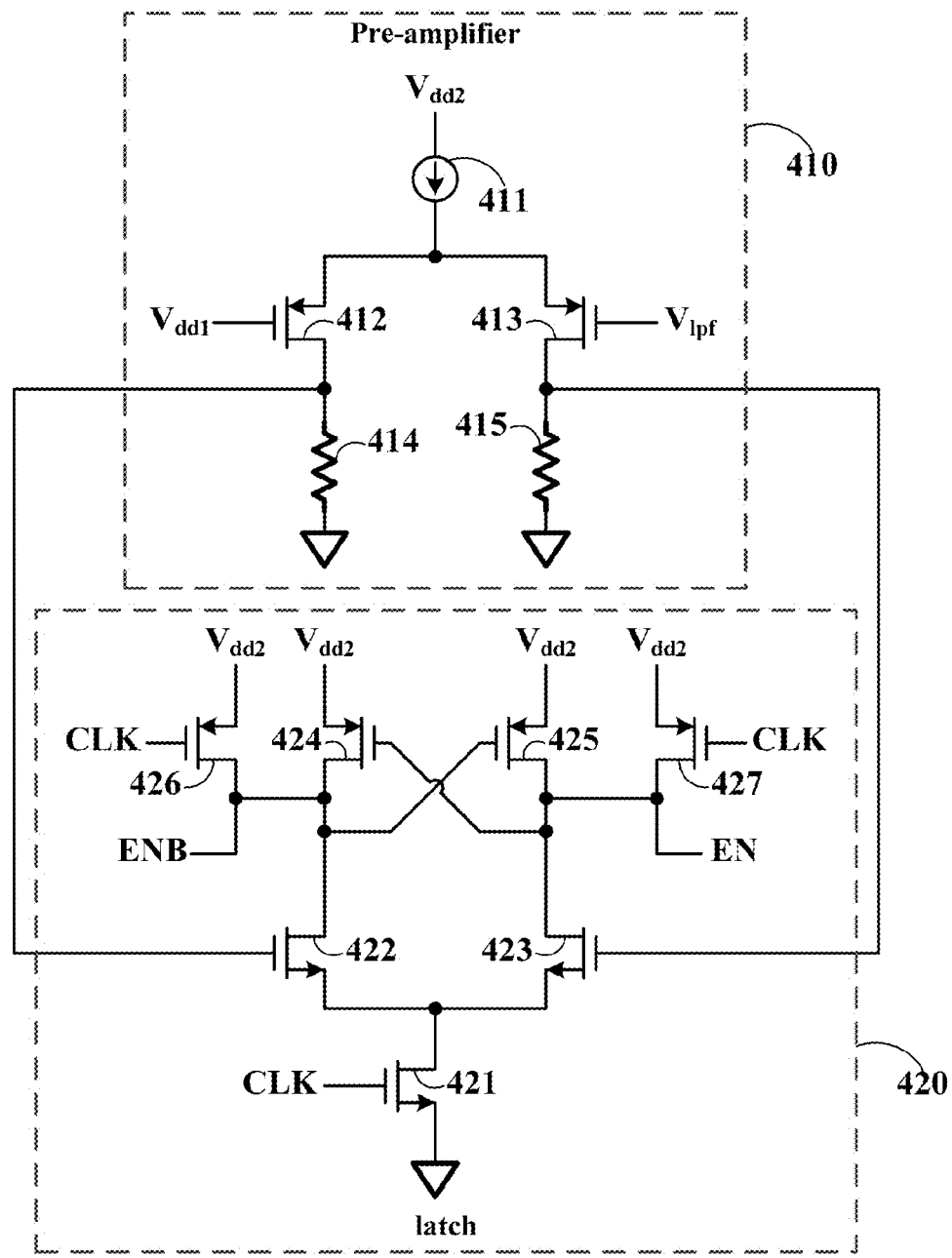
FIG. 4 shows a schematic diagram of a comparator suitable for the power bouncing reduction circuit of FIG. 3.

A schematic diagram of a comparator 400 suitable for embodying comparator 320 of FIG. 3 is depicted in FIG. 4. Comparator 400 comprises a pre-amplifier 410 and a latch 420. Pre-amplifier 410 comprises: current source 411, NMOS transistors 412 and 413, and resistors 414 and 415. Latch 420 comprises: NMOS transistors 421, 422, and 423, and PMOS transistors 424, 425, 426, and 427. Both pre-amplifier 410 and latch 420 are well known in prior art and thus no detailed explanations are given here. Note that EN is complementary to ENB. When CLK is low, both EN and ENB are pulled up to Vdd2; when CLK is high, a comparison is been made, and as a result ENB will either stay at Vdd2 or be pulled down to ground, and EN is a logical inversion of ENB.

Figure 5:
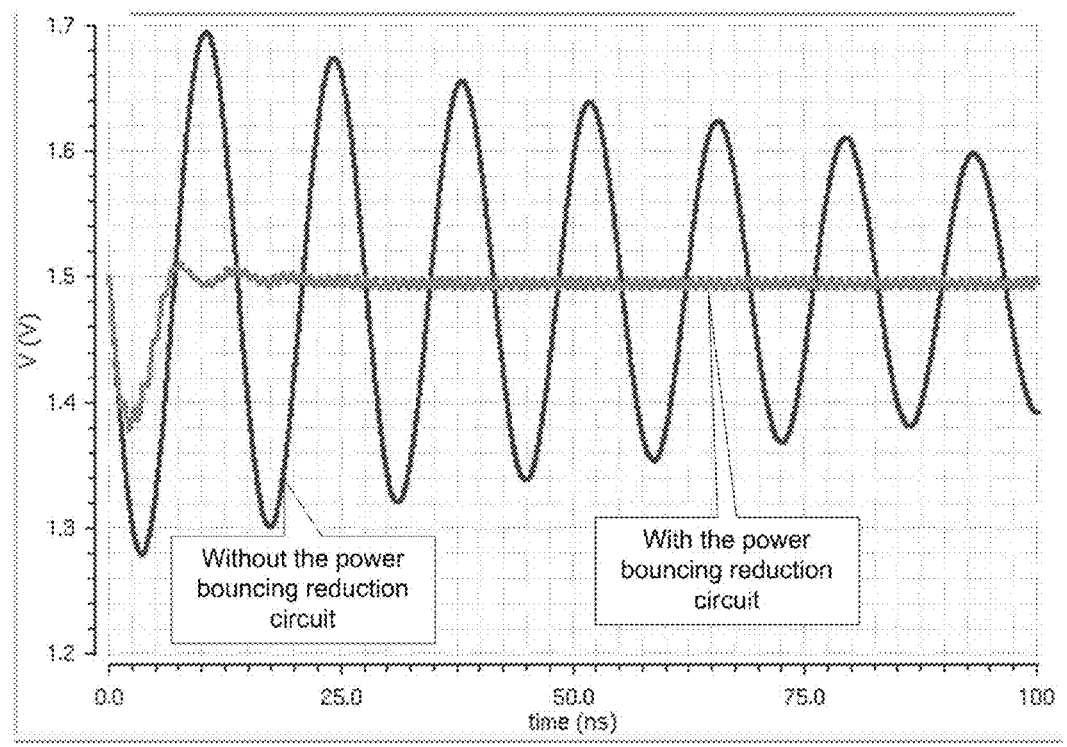
FIG. 5 shows a simulation result for the power bouncing reduction circuit of FIG. 3.

A result of a circuit simulation for the voltage waveform of the first internal power supply voltage Vdd1 in response to a sudden surge of the first current I1 (please refer to FIG. 2) for the power bouncing reduction circuit 300 is shown in FIG. 5. Two traces are shown for comparison: one with the power bouncing reduction circuit, and the other without the power bouncing reduction circuit. It is evident that the power bouncing reduction circuit greatly reduces the power bouncing.

Reference is now made to FIG. 3. In an alternative embodiment not shown in the figure but will be obvious to those of ordinary skill in the art, the two input terminals "+" and "−" of the comparator 320 are swapped and a NMOS transistor is used to replace the PMOS transistor 331. If comparator 400 were to be used for this alternative embodiment, the latch 420 needs to be "flipped" where: every NMOS transistor is replaced with a PMOS transistor; every PMOS transistor is replaced with a NMOS transistor; and the ground and Vdd2 are swapped.

Figure 6:
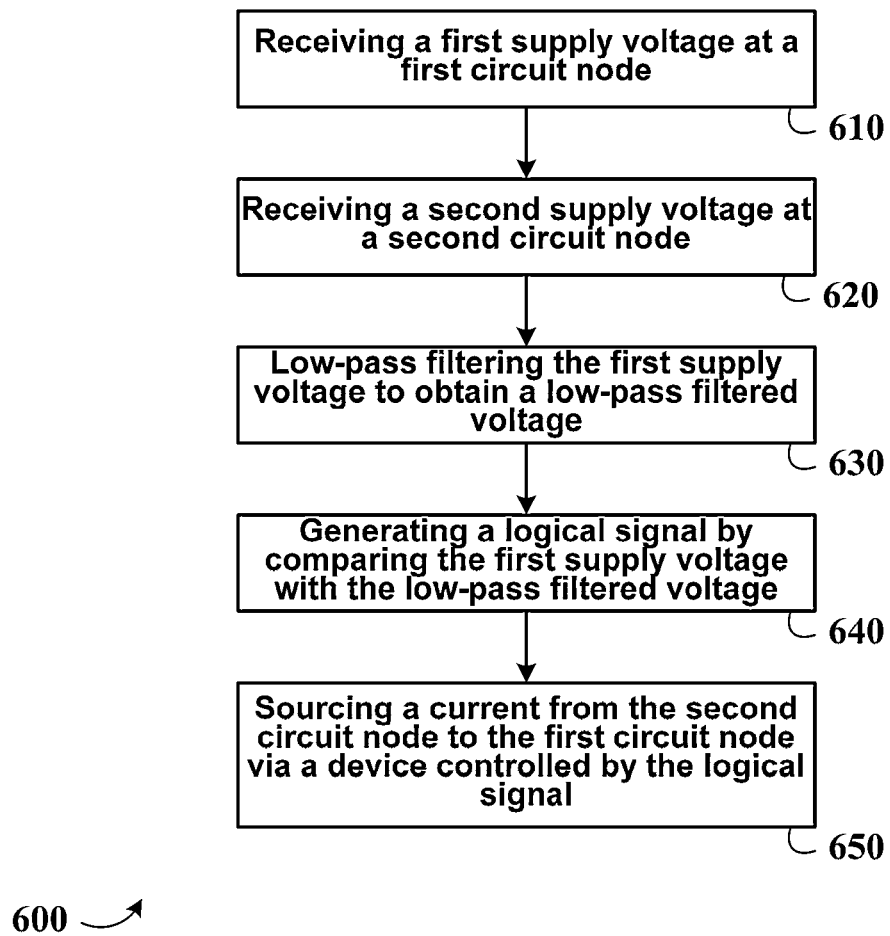
FIG. 6 shows a flow chart of a method in accordance with the present invention.

As demonstrated by a flow chart 600 shown in FIG. 6, a method comprises: step 610 for receiving a first supply voltage at a first circuit node; step 620 for receiving a second supply voltage from a second circuit node; step 630 for low-pass filtering the first supply voltage to obtain a low-pass filtered voltage; step 640 for generating a logical signal by comparing the first supply voltage with the low-pass filtered voltage; and step 650 for sourcing a current from the second circuit node to the first circuit node via a device controlled by the logical signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit comprising:
  a core circuit for sinking a first current from a first internal power supply node;
  a power bouncing reduction circuit receiving power from a second internal power supply node and sourcing a second current to the first internal power supply node in accordance with a comparison between a voltage at the first internal power supply node and a low-pass filtered voltage of the first internal power supply node; and
  a package coupling the first internal power supply node and the second internal power supply node to a first external power supply node and a second external power supply node, respectively.

2. The circuit of claim 1, wherein the power bouncing reduction circuit comprises: a low-pass filter receiving the voltage at the first internal power supply node and outputting the low-pass filtered voltage;
  a comparator receiving the voltage at the first internal power supply node and the low-pass filtered voltage and outputting a logical signal; and an output device for sourcing the second current from the second internal power supply node to the first internal power supply node in accordance with a control by the logical signal.

3. The circuit of claim 2, wherein the output device comprises a PMOS transistor.

4. The circuit of claim 2, wherein the comparator comprises a pre-amplifier and a latch.

5. The circuit of claim 1, wherein the second current is turned off when the comparison indicates that the voltage at the first internal power supply node is higher than the low-pass filtered voltage.

6. The circuit of claim 1, wherein the second current is turned on when the comparison indicates that the voltage at the first internal power supply node is lower than the low-pass filtered voltage.

7. A method comprising:
receiving a first supply voltage at a first node;
receiving a second supply voltage from a second node;
low-pass filtering the first supply voltage to obtain a low-pass filtered voltage;
generating a logical signal by comparing the first supply voltage with the low-pass filtered voltage; and
sourcing a current from the second node to the first node via a device controlled by the logical signal.

* * * * *